US008646406B2

(12) United States Patent
Ahn et al.

(10) Patent No.: US 8,646,406 B2
(45) Date of Patent: Feb. 11, 2014

(54) MASK ASSEMBLY HAVING A FRAME WITH SUPPORT STICK

(75) Inventors: Hong-Kyun Ahn, Yongin (KR); Se-Young Oh, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 296 days.

(21) Appl. No.: 12/926,700

(22) Filed: Dec. 6, 2010

(65) Prior Publication Data

US 2011/0139069 A1 Jun. 16, 2011

(30) Foreign Application Priority Data

Dec. 11, 2009 (KR) .................. 10-2009-0123322

(51) Int. Cl.
*B05C 11/11* (2006.01)
*B05B 15/04* (2006.01)
*B05C 5/00* (2006.01)
*B05D 1/32* (2006.01)
*B05D 5/00* (2006.01)

(52) U.S. Cl.
USPC ........... 118/505; 118/301; 118/503; 118/504; 427/468; 427/272; 427/282; 257/E33.001; 313/504; 445/60

(58) Field of Classification Search
USPC .................. 118/504, 301, 505; 257/E33.001; 427/272, 282, 468; 313/504; 445/60
See application file for complete search history.

(56) References Cited

U.S. PATENT DOCUMENTS

| 3,226,255 | A | * | 12/1965 | Cieniewicz et al. | .......... 438/758 |
| 3,747,558 | A | * | 7/1973 | Harel | ............. 118/664 |
| 4,511,599 | A | * | 4/1985 | Rustomji | ........ 427/66 |
| 5,286,343 | A | * | 2/1994 | Hui | ................ 216/41 |
| 5,847,813 | A | * | 12/1998 | Hirayanagi | ........ 355/75 |
| 6,162,566 | A | * | 12/2000 | Amemiya | ........... 430/5 |
| 6,611,089 | B2 | * | 8/2003 | Kim et al. | ........ 313/407 |
| 6,777,143 | B2 | * | 8/2004 | Lin | ................ 430/22 |
| 6,858,086 | B2 | * | 2/2005 | Kang | ........... 118/720 |
| 6,893,709 | B2 | * | 5/2005 | Kitazume | ........ 428/192 |
| 6,926,840 | B2 | * | 8/2005 | Clark | ............. 216/12 |
| 7,006,202 | B2 | * | 2/2006 | Byun et al. | ....... 355/75 |
| 7,388,653 | B2 | * | 6/2008 | Kim | ................ 355/77 |
| 7,745,073 | B2 | * | 6/2010 | Suguro et al. | ........ 430/5 |
| 7,943,443 | B2 | * | 5/2011 | Yamazaki et al. | ....... 438/155 |
| 7,987,812 | B2 | * | 8/2011 | Kim et al. | ........ 118/504 |
| 8,343,278 | B2 | * | 1/2013 | Sung et al. | ........ 118/720 |
| 8,404,125 | B2 | * | 3/2013 | Matsudate et al. | ....... 216/12 |
| 2003/0101932 | A1 | * | 6/2003 | Kang | ........... 118/504 |

(Continued)

FOREIGN PATENT DOCUMENTS

| CN | 1607868 A | 4/2005 |
| CN | 1776525 A | 5/2006 |

(Continued)

*Primary Examiner* — Dah-Wei Yuan
*Assistant Examiner* — Karl Kurple
(74) *Attorney, Agent, or Firm* — Lee & Morse, P.C.

(57) ABSTRACT

A mask assembly includes a frame with an opening, at least one support stick in the frame and extending in a first direction to traverse the opening of the frame, the support stick including a communication pattern above the opening of the frame, and a mask positioned on the frame and the at least one support stick, the mask extending in a second direction perpendicular to the first direction to traverse the opening of the frame, and the mask being exposed to the opening of the frame through the communication pattern.

15 Claims, 9 Drawing Sheets

(56) References Cited

U.S. PATENT DOCUMENTS

| | | | |
|---|---|---|---|
| 2003/0221614 A1* | 12/2003 | Kang et al. | 118/504 |
| 2004/0202821 A1* | 10/2004 | Kim et al. | 428/137 |
| 2006/0103289 A1* | 5/2006 | Kim et al. | 313/402 |
| 2008/0018236 A1* | 1/2008 | Arai et al. | 313/504 |
| 2009/0137180 A1* | 5/2009 | Sung et al. | 445/60 |
| 2009/0151630 A1* | 6/2009 | Marcanio et al. | 118/504 |
| 2011/0067630 A1* | 3/2011 | Ko et al. | 118/721 |
| 2011/0146573 A1* | 6/2011 | Park | 118/712 |
| 2011/0179996 A1* | 7/2011 | Park et al. | 118/504 |
| 2011/0185965 A1* | 8/2011 | Park et al. | 118/504 |
| 2011/0185966 A1* | 8/2011 | Lee et al. | 118/504 |
| 2011/0220019 A1* | 9/2011 | Lee et al. | 118/504 |
| 2011/0306216 A1* | 12/2011 | Schuessler et al. | 438/758 |
| 2012/0279444 A1* | 11/2012 | Hong | 118/504 |
| 2012/0282445 A1* | 11/2012 | Kim | 428/209 |
| 2012/0325143 A1* | 12/2012 | Kang | 118/504 |

FOREIGN PATENT DOCUMENTS

| | | |
|---|---|---|
| JP | 2004-335382 A | 11/2004 |
| KR | 10 2000-0072485 A | 12/2000 |
| KR | 10 2005-0033086 A | 4/2005 |
| KR | 10 2008-0054741 A | 6/2008 |
| KR | 10 2009-0053417 A | 5/2009 |
| KR | 10 2009-0059225 A | 6/2009 |
| KR | 10-2009-0105614 A | 10/2009 |

* cited by examiner

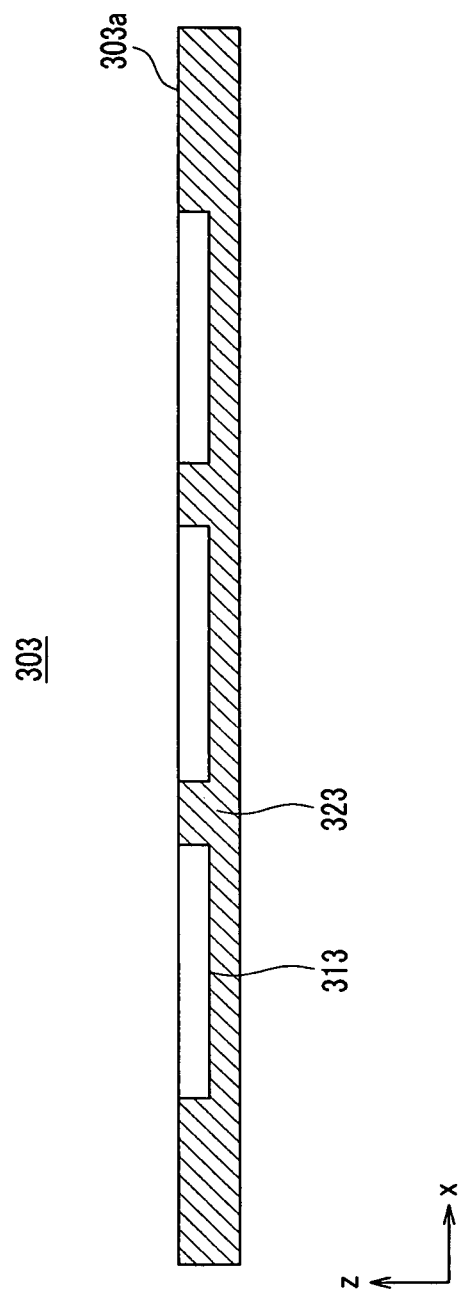

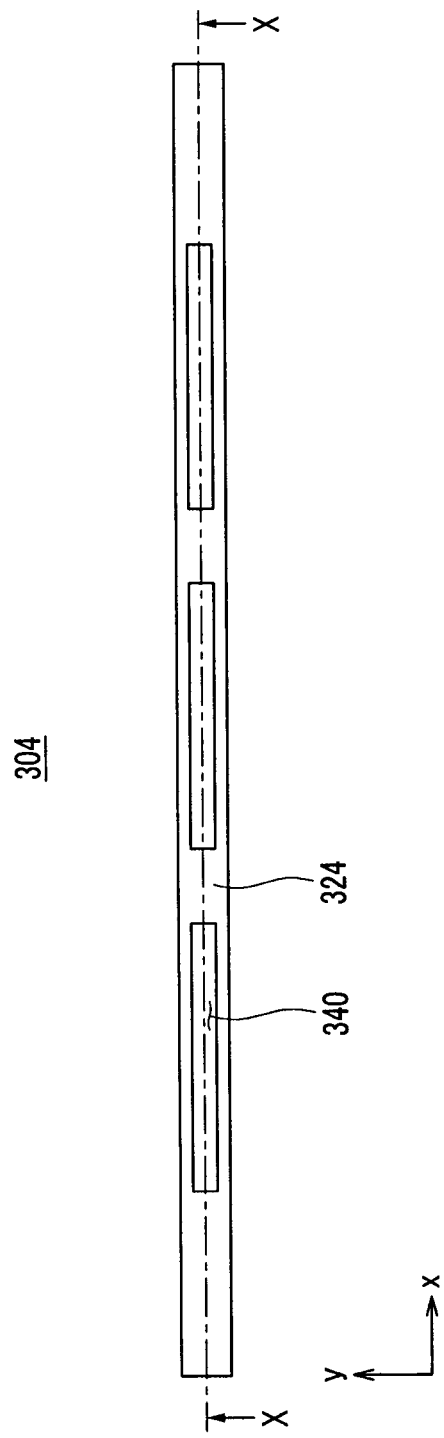

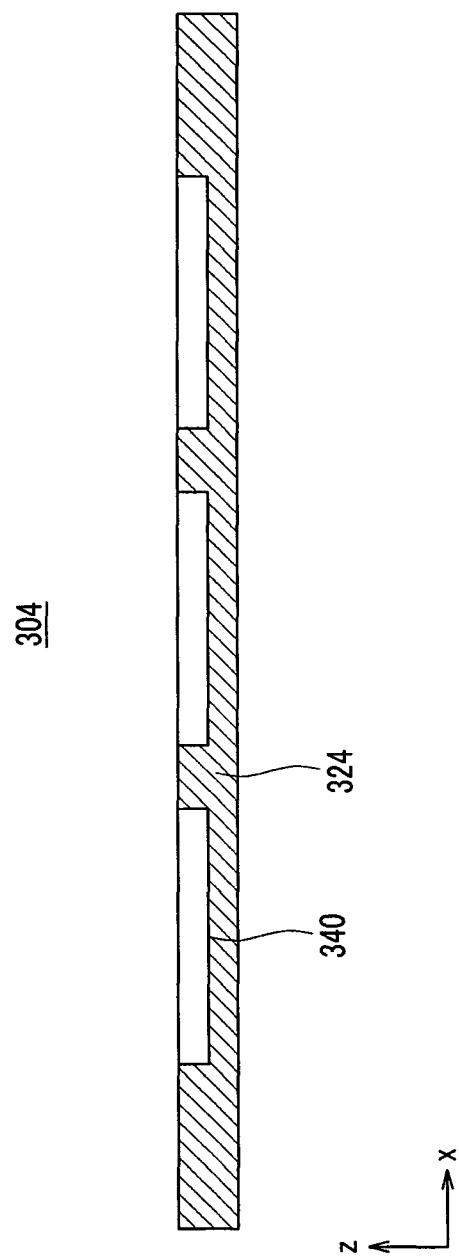

MASK ASSEMBLY HAVING A FRAME WITH SUPPORT STICK

BACKGROUND

1. Field

The described technology relates generally to a mask assembly, and more particularly, to a mask assembly including a frame supporting a mask.

2. Description of the Related Art

A flat panel display may be manufactured to be lighter and smaller than, e.g., a cathode ray tube (CRT). Examples of a flat panel display may include an organic light emitting diode (OLED) display, a liquid crystal display (LCD), a plasma display panel (PDP), etc. For example, in order to manufacture a flat panel display, e.g., an OLED display, an electrode with a particular pattern, a light emission layer, and the like may be formed by a deposition method using a mask assembly.

A conventional mask assembly may include a frame having an opening and a plurality of band-shaped (or stripe-shaped) masks fixed to the frame above the opening. Each of the masks may include a plurality of pattern openings to allow a plurality of OLED displays to be manufactured on a substrate. The pattern openings of the masks may correspond to a single OLED display, and may be formed with a shape corresponding to the electrode or the light emission layer. However, as a central portion of the masks is above the opening of the frame, the central portion of the masks may sag due to a weight of the substrate or the masks themselves.

The above information disclosed in this Background section is only for enhancement of understanding of the background of the described technology and therefore it may contain information that does not form the prior art that is already known in this country to a person of ordinary skill in the art.

SUMMARY

Embodiments are directed to a mask assembly, which substantially overcomes one or more of the problems due to the limitations and disadvantages of the related art.

It is therefore a feature of an embodiment to provide a mask assembly having a structure capable of preventing damage to masks thereon from a support stick.

At least one of the above and other features and advantages may be realized by providing a mask assembly, including a frame with an opening, at least one support stick in the frame and extending in a first direction to traverse the opening of the frame, the support stick including a communication pattern above the opening of the frame, and a mask positioned on the frame and the at least one support stick, the mask extending in a second direction perpendicular to the first direction to traverse the opening of the frame, and the mask being exposed to the opening of the frame through the communication pattern.

The support stick may further include a contact support portion that is adjacent to the communication pattern and is in contact with the mask.

The communication pattern may be formed to penetrate the support stick.

The communication pattern may be formed to be depressed from the surface of the support stick.

A plurality of communication patterns may be formed, and the contact support may be positioned between neighboring communication patterns.

The communication patterns may have a polygonal shape.

The communication patterns may have a circular shape.

A surface area of the contact support portion contacting the mask may be smaller than an area of the communication pattern overlapping the mask.

The frame may further include insertion portions into which both ends of the support stick are inserted, and the depth of the insertion portion may be substantially equal to the thickness of the support stick.

A plurality of masks may be formed and disposed along the first direction.

Both ends of the mask may be supported by the frame in a state that a tensile force is applied thereto.

The mask may directly contact only a portion of an upper surface of the support stick.

The support stick may have a predetermined width and a predetermined length, a surface area of an upper surface of the support stick contacting the mask being smaller than a product of the predetermined length and width.

A portion of the mask overlapping the communication pattern may not directly contact an upper surface of the support stick.

At least one of the above and other features and advantages may also be realized by providing a mask assembly, including a frame with an opening, at least one support stick in the frame and extending in a first direction to traverse the opening of the frame, the support stick including at least one groove above the opening of the frame, and a mask positioned on the frame and the at least one support stick, the mask extending in a second direction perpendicular to the first direction to traverse the opening of the frame, and the mask defining a closed space with the at least one groove.

The support stick may further include a contact support portion that covers the groove from an upper surface of the support stick and is in contact with the mask.

The groove may be formed to be depressed from the upper surface of the support stick.

The groove may be enclosed between the mask and the contact support portion of the support stick.

BRIEF DESCRIPTION OF THE DRAWINGS

The above and other features and advantages will become more apparent to those of ordinary skill in the art by describing in detail exemplary embodiments with reference to the attached drawings, in which:

FIG. 8 illustrates a cross-sectional view taken along line VIII-VIII in FIG. 7.

FIG. 9 illustrates a top plan view of a support stick included in a mask assembly according to a fourth exemplary embodiment.

FIG. 10 illustrates a cross-sectional view taken along line X-X in FIG. 9.

DETAILED DESCRIPTION

Figure 1:
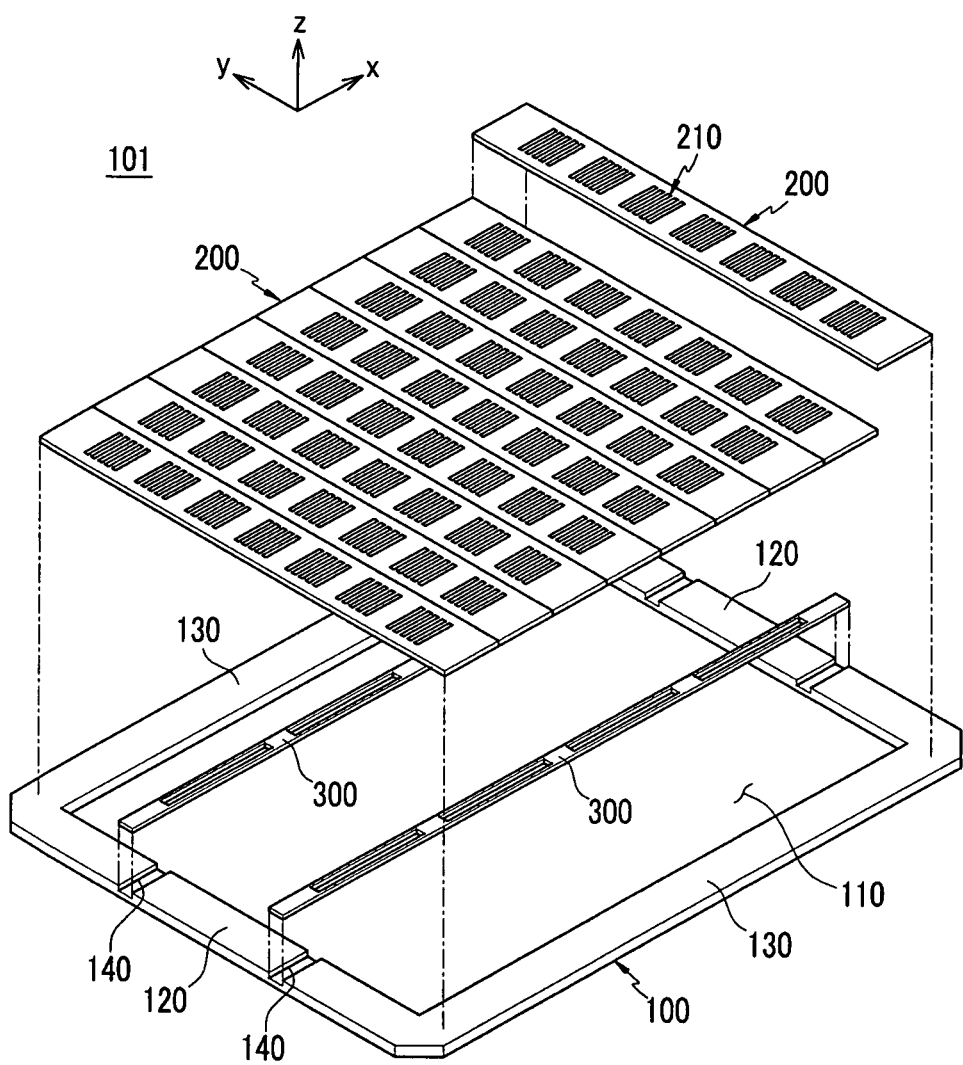
FIG. 1 illustrates an exploded perspective view of a mask assembly according to a first exemplary embodiment.

Korean Patent Application No. 10-2009-0123322, filed on Dec. 11, 2009, in the Korean Intellectual Property Office, and entitled: "Mask Assembly," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of elements and regions may be exaggerated for clarity of illustration. It will also be understood that when a layer or element is referred to as being "on" another element or substrate, it can be directly on the other element or substrate, or intervening elements may also be present. In addition, it will also be understood that when an element is referred to as being "between" two elements, it can be the only element between the two elements, or one or more intervening elements may also be present. Like reference numerals refer to like elements throughout.

Figure 3:
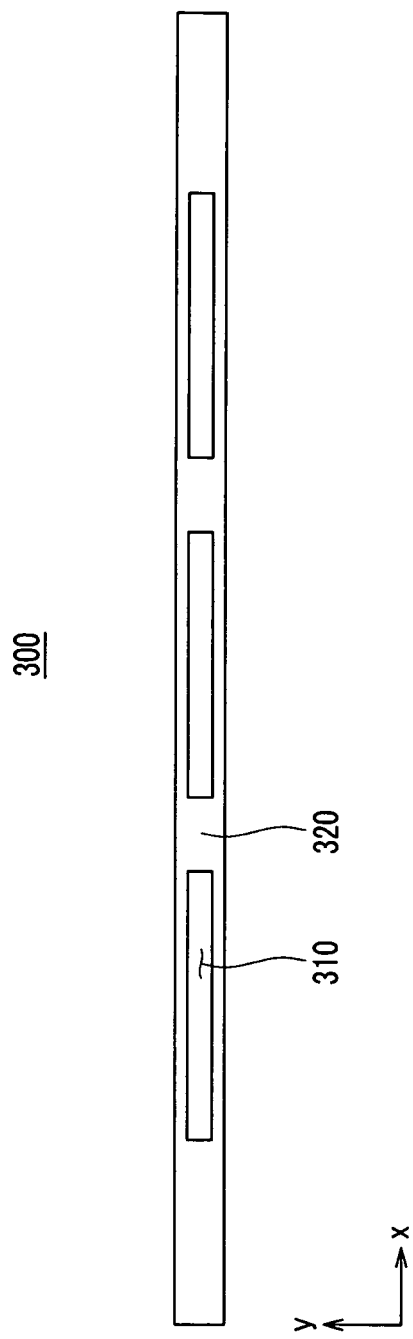
FIG. 3 illustrates a top plan view of a support stick included in the mask assembly according to the first exemplary embodiment.
Figure 4:
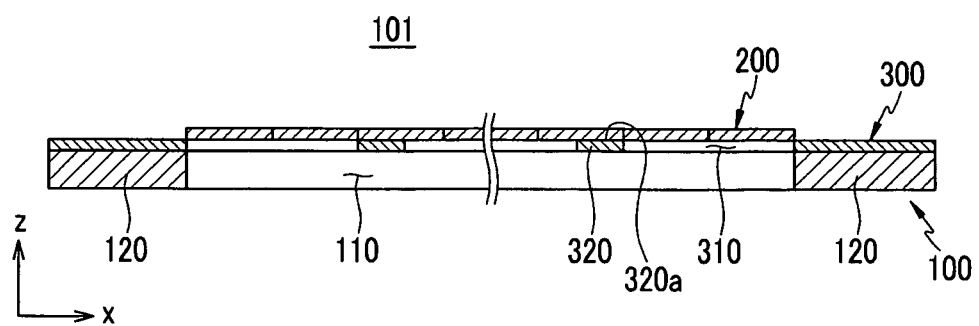
FIG. 4 illustrates a cross-sectional view taken along line IV-IV in FIG. 2.

A mask assembly according to a first exemplary embodiment will now be described with reference to FIGS. 1 to 4. FIG. 1 illustrates an exploded perspective view of a mask assembly according to the first exemplary embodiment, FIG. 2 illustrates a top plan view of the mask assembly in FIG. 1, and FIGS. 3-4 illustrate respective top and cross-sectional views of a support stick in the mask assembly according to the first exemplary embodiment.

Figure 2:
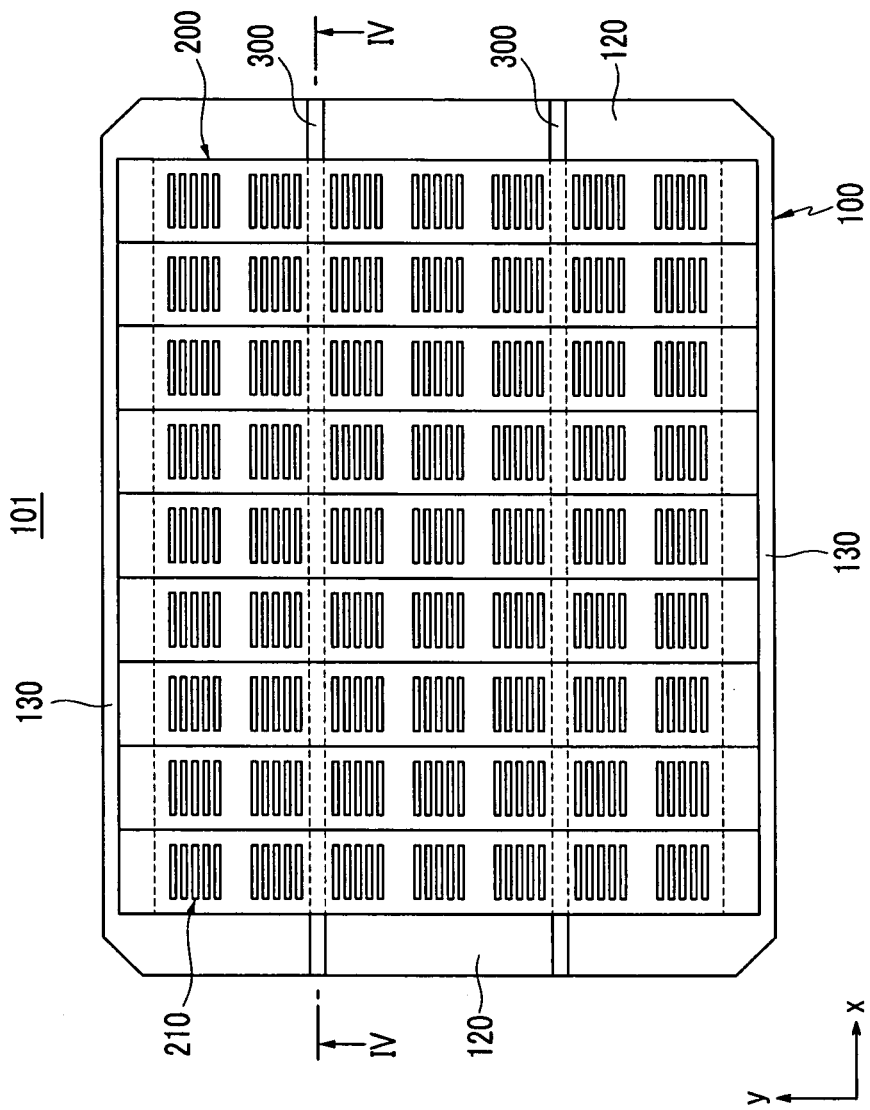
FIG. 2 illustrates a top plan view of a mask assembly according to the first exemplary embodiment.

As shown in FIGS. 1 and 2, a mask assembly 101 according to the first exemplary embodiment may include a frame 100, a mask 200, and at least one support stick 300. The mask 200 and the at least one support stick 300 may be positioned on the frame 100.

The frame 100 may fix and support both ends of the mask 200 and the support sticks 300, and may include an opening 110 exposing the mask 200. In detail, the frame 100 may include a pair of first supports 120 that face each other with the opening 110 interposed therebetween along a first direction, i.e., along the x-axis direction, and a pair of second supports 130 that face each other with the opening 110 interposed therebetween along a second direction, i.e., the y-axis direction, crossing the first direction. The first and second supports 120 and 130 may be alternately arranged in a quadrangular shape, e.g., a rectangle, to form the frame 100. The opening 110 may be in a center of the frame 100 and surrounded by the frame 100.

The support stick 300 may extend, e.g., along the first direction, and may be fixed to the first supports 120. That is, the support stick 300 may extend across the opening 110, so each side of the support stick 300 may be fixed to one of the first supports 120, as will be discussed in more detail below. The mask 200 may extend, e.g., along the second direction, so each of the ends of the mask 200 may be fixed to one of the second supports 130 by using a fixing method, e.g., welding or the like. In the frame 100 of the mask assembly 101 according to the first exemplary embodiment, the first supports 120 may form shorter sides of the frame 100 in a rectangular shape, and the second supports 130 may form the longer sides of the frame 100. However, other configurations of the frame 100 are within exemplary embodiments, e.g., the first and second supports 120 and 130 may be formed to have a substantially same length, the frame of the mask assembly 101 may have a polygonal shape or a circular shape, etc.

The frame 100 may further include insertion portions 140, in which both ends of the support sticks 300 are positioned. That is, the insertion portions 140 may be depressed to a predetermined depth along the z-axis into the first supports 120, as compared to an upper surface of the second supports 130, to form grooves. The depth of the insertion portions 140 in the first supports 120 may substantially equal a thickness of the support stick 300. Therefore, when both ends of the support stick 300 are inserted into the insertion portions 140, upper surfaces of the support stick 300 and the frame 100 are at the same level, i.e., upper surfaces of the support stick 300 and the frame 100 that are facing the mask 200 may be substantially coplanar. Thus, because both ends of the support stick 300 are inserted in the frame 100, the frame 100 and the support stick 300 may be in the contact with the mask 200 at the same level.

The mask 200 may be fixed to and supported by the frame 100 in a state in which a tensile force is applied to the mask 200 along the second direction. That is, as the tensile force is applied to the mask 200, i.e., to extend the mask 200 along the second direction between the second supports 130, a compressive force may act on the frame 100, e.g., on the second supports 130, along the second direction. The frame 100 may be made of a metallic material having high rigidity, e.g., stainless steel or the like, so as to prevent the frame 100 from being deformed by the compressive force caused by the mask 200. It is noted that since the mask 200 is supported by the frame 100 in the state that a tensile force is applied to the mask 200, a uniform tensile force may be applied in the second direction (y-axis direction), and thus, a concentration of stress at a particular portion of the mask 200 may be minimized. That is, the mask 200 may be prevented from being deformed due to thermal expansion, e.g., during deposition, and the pattern portions 210 of the mask 200 may be prevented from being deformed.

The mask 200 may extend in the second direction (i.e., in the y-axis direction) with both ends thereof supported by the frame 100, and may include pattern portions 210. The pattern portions 210 may expose a mother substrate, i.e., on which an organic light emitting diode (OLED) display is to be formed, to a deposition means during a deposition process. The pattern portions 210 may be open patterns, e.g., that correspond to wiring, light emission layers, or the like, generally constituting the OLED display.

A plurality of masks 200 may be formed on the frame 100 and disposed adjacent to each other along the first direction (i.e., along the x-axis direction). Accordingly, because the plurality of masks 200, each having the pattern portions 210 that correspond to a single OLED display, is disposed in the first direction (x-axis direction), a plurality of OLED displays may be formed on the mother substrate by using the single mask assembly 101. Also, because the mask assembly 101 is configured by disposing and fixing the plurality of masks 200 on the frame 100, only those with good pattern precision may be selected from the plurality of masks 200 and disposed on the frame 100, and thus a configuration error of the pattern portions 210 included in the mask 200 may be reduced.

The support stick 300, e.g., two supports sticks 300, may be positioned over the opening 110 of the frame 100, so both ends of each support stick 300 may be inserted in the insertion portions 140 of the frame 100 to be supported by the frame 100. As the support sticks 300 extend in the first direction (x-axis direction) crossing the second direction (y-axis direction) over the opening 110, the support sticks 300 may support the mask 200 in a contact manner, i.e., between the mask 200 and the frame 100.

The support sticks 300 may be positioned such that they traverse the opening 110 of the frame 100 at a lower side of the plurality of masks 200, i.e., under the masks 200, and may be in contact with a central portion of the masks 200 floating over the opening 110 to support the mask 200. The support sticks 300 may be made of a material with high rigidity, e.g., the support sticks 300 may be made of a substantially same material as that of the frame 100. When the frame 100 and the support sticks 300 are made of the same material, the frame 100 and the support sticks 300 have the same thermal expansion characteristics, so overall deformation of the mask assembly 101, e.g., due to a difference in thermal expansion characteristics, may be suppressed during the deposition process.

One or a plurality of support sticks 300 may be provided, which may have various cross-sections, e.g., circular cross-sections or polygonal cross-sections. The plurality of support sticks 300 may be separately positioned, e.g., spaced apart from each other along the second direction (the y-axis direction). The support sticks 300 may be positioned between the pattern portions 210 of the masks 200 so as not to cover the pattern portions 210 during the deposition process. For example, the mask assembly 101 according to the first exemplary embodiment may include two support sticks 300 having a rectangular cross-sectional shape. In a different exemplary embodiment, the cross-sectional shape of the support sticks may be a circular shape or a polygonal shape, and the number of support sticks may be three or more.

A structure of the support sticks 300 will be described in more detail below with reference to FIGS. 3-4. FIG. 3 illustrates a top plan view of the support stick 300 according to the first exemplary embodiment, and FIG. 4 illustrates a cross-sectional view of the support stick 300 on the frame 100 along line IV-IV in FIG. 2.

As shown in FIGS. 3 and 4, the support stick 300 may include a communication pattern 310 and a contact support portion 320. The contact support portion 320 may extend along the first direction, i.e., along the x-axis, and the communication pattern 310 may define openings through the contact support portion 320, e.g., through an entire thickness of the support stick 300 along the z-axis.

In detail, as illustrated in FIG. 4, the communication pattern 310 may be formed to penetrate the support stick 300, e.g., a depth of the communication pattern 310 along the z-axis may substantially equal the thickness of the support stick 300 along the z-axis. Because the communication pattern 310 penetrates the support stick 300, a portion of the mask 200 corresponding to, e.g., overlapping, the communication pattern 310 may communicate with the opening 110. In other words, the mask 200 may contact only the contact support portion 320, so the portion of the mask 200 overlapping the communication pattern 310 may not contact the support stick 300. The communication pattern 310 may include a plurality of openings spaced apart from each other along the first direction, and each opening may have a quadrangular, e.g., rectangular, shape. The openings of the communication pattern 310 may be arranged to alternate with portions of the contact support portion 320, e.g., a portion of the contact support portion 320 may be positioned between two adjacent openings of the communication pattern 310.

The contact support portion 320 may be continuous along the first direction, and may be adjacent to the communication pattern 310, e.g., the contact support portion 320 may surround the openings of the communication pattern 310. The contact support portion 320 may be in contact with the masks 200 to support the central portion of the masks 200. For example, as illustrated in FIGS. 1 and 3-4, a length of each portion of the contact support portion 320 between two facing edges of adjacent openings of the communication pattern 310 may be smaller than a length of each opening of the communication pattern 310. For example, as illustrated in FIG. 4, a length of each opening of the communication pattern 310 along the first direction may overlap a width of two masks 200. It is noted that the lengths refer to distances along the first direction.

Because the support stick 300 includes the communication patterns 310 formed to penetrate the support stick 300, a portion of the mask 200 corresponding to the communication patterns 310 may communicate with the opening 110. Therefore, only the contact support portion 320 of the support stick 300 may be in contact with the masks 200. That is, because only the contact support portion 320, i.e., excluding a portion of the support stick 300 facing the masks 200 and including the communication pattern 310, contacts the masks 200, generation of damage to the masks 200 in contact with the support stick 300 due to interference from the support stick 300 may be prevented or substantially minimized.

In more detail, when a process of cleansing is performed on the mask assembly 101 including the support sticks 300 having the bar shape extending in the first direction (x-axis direction), the support sticks 300 contacting the masks 200 may resonate due to use of waves, e.g., ultrasonic waves or the like, as a cleaning means. In this case, although the support sticks 300 resonate, only the contact support portion 320 contacts the masks 200, i.e., may interfere with the masks 200, and thus damage to the masks 200 due to the resonance of the support sticks 300 may be suppressed. In other words, since a surface area of the support sticks 300 contacting the masks 200 includes only a surface area of the contact support portion 320 facing the masks 200, i.e., an upper surface 320a, the surface area of the support sticks 300 contacting the masks 200 may be substantially reduced, i.e., due to the openings in the communication pattern 310. Therefore, only a relatively small portion of the support sticks 300 may be in direct contact with the masks 200 during resonance, i.e., vibration. As such, the damage to the masks 200 may be substantially reduced. In contrast, when a mask assembly includes a support stick without a communication pattern, an entire upper surface, e.g., a rectangular surface area including entire length and width of the support stick along respective first and second directions, may contact the masks and cause damage to a large area of the masks due to resonance.

Figure 5:
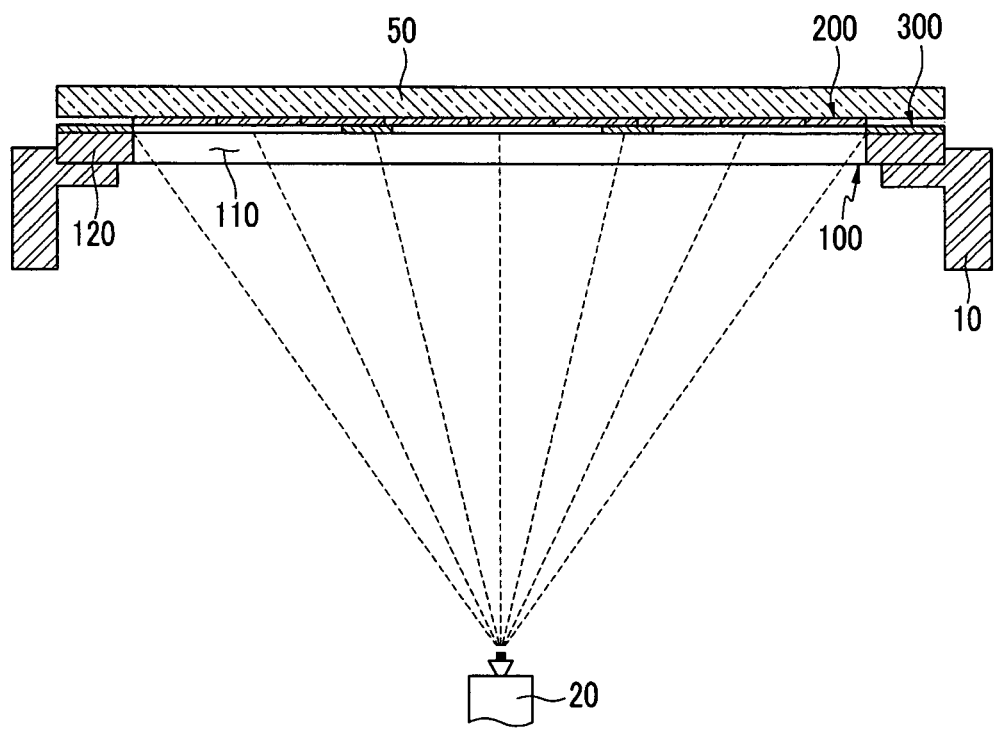
FIG. 5 illustrates a schematic cross-sectional view of a deposition process of an organic light emitting diode (OLED) display using a mask assembly according to the first exemplary embodiment.

The deposition process of the OLED display using the mask assembly 101 according to the first exemplary embodiment will now be described with reference to FIG. 5. FIG. 5 illustrates a schematic cross-sectional view of a deposition process of an OLED display using the mask assembly 101.

As shown in FIG. 5, the frame 100 of the mask assembly 101 may be mounted on a frame holder 10 within a deposition facility, and a mother substrate 50 may be mounted on the plurality of masks 200. Next, a deposition material, e.g., an electrode material, a light emission layer material, or the like, may be evaporated from a deposition unit 20 to be deposited on the mother substrate 50 through the pattern portions 210 of the masks 200, such that the deposited material on the mother substrate 50 may have a same shape as that of the pattern portions 210.

In this manner, a plurality of OLED displays may be manufactured on a single sheet of the mother substrate 50 by using the mask assembly 101. During the deposition process, the mother substrate 50 may be mounted on the plurality of masks 200 floating over the opening 110 of the frame 100. However, because the plurality of masks 200 are supported by the support sticks 300, the masks 200, e.g., central portions of the masks 200 above the opening 110, may be prevented from sagging downward due to the weight of the mother substrate 50 or due to the weight of the masks 200. Namely, deformation of the masks 200 may be prevented by the support sticks 300, and accordingly precision during the deposition process may be improved.

As described above, because the mask assembly 101 according to the first exemplary embodiment includes the support sticks 300, the precision during the deposition process may be improved. Further, the structure of the support sticks 300 may prevent or substantially minimize damage to the masks 200.

Figure 6:
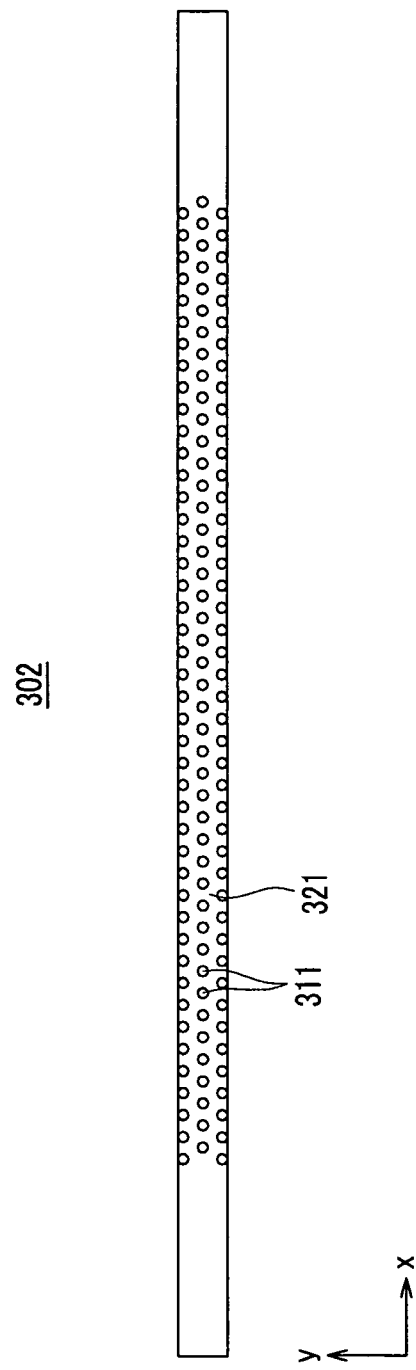
FIG. 6 illustrates a top plan view of a support stick included in a mask assembly according to a second exemplary embodiment.

A mask assembly according to a second exemplary embodiment will now be described with reference to FIG. 6. FIG. 6 illustrates a top plan view of a support stick according to the second exemplary embodiment.

As shown in FIG. 6, a support stick 302 of a mask assembly according to the second exemplary embodiment may include a communication pattern 311 and a contact support portion 321. The communication pattern 311 may define openings through the contact support portion 321, e.g., through an entire thickness of the support stick 302 along the z-axis.

In detail, as illustrated in FIG. 6, the communication pattern 311 may be formed to penetrate the support stick 302 and have a circular shape. Because the communication pattern 311 is formed to penetrate the support stick 300, a portion of the mask 200 corresponding to, e.g., overlapping, the communication pattern 311 may communicate with the opening 110. In other words, the mask 200 may contact only the contact support portion 321, so the portion of the mask 200 overlapping the communication pattern 311 may not contact the support stick 300. The communication pattern 311 may include a plurality of circular openings spaced apart from each other along the first and second directions, e.g., the circular openings may be arranged in a two-dimensional matrix. A part of the contact support portion 321 may be positioned between adjacent openings of the communication pattern 311.

The contact support portion 321 may be adjacent to the communication pattern 311 formed to penetrate the support stick 302, and may be in contact with the masks 200 to support the central portion of the masks 200. In this manner, in the mask assembly according to the second exemplary embodiment, because only the contact support portion 321 which is a small portion of the entire surface of the support stick 302 facing the masks 200 is in contact with the masks 200, i.e., due to presence of the circular openings of the communication pattern 311 formed to penetrate the support stick 302, damage to the masks 200 by the support stick 302 can be substantially reduced, e.g., as compared with a related art mask assembly.

Figure 7:
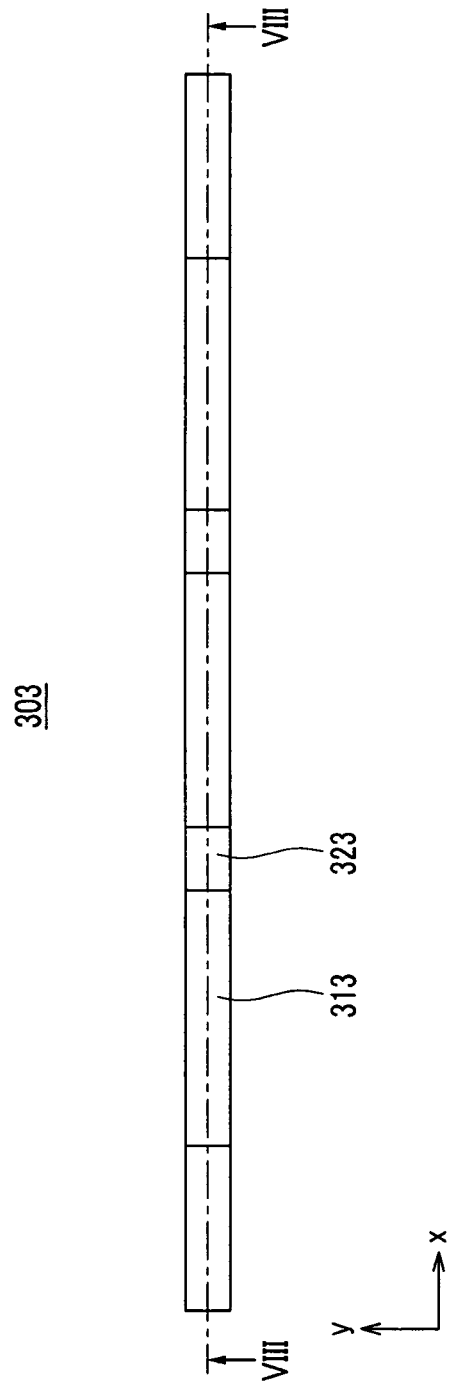
FIG. 7 illustrates a top plan view of a support stick included in a mask assembly according to a third exemplary embodiment.

A mask assembly according to a third exemplary embodiment will now be described with reference to FIGS. 7 and 8. FIG. 7 illustrates a top plan view of a support stick according to a third exemplary embodiment, and FIG. 8 illustrates a cross-sectional view taken along line VIII-VIII in FIG. 7.

As shown in FIGS. 7 and 8, a support stick 303 of a mask assembly according to the third exemplary embodiment may include a communication pattern 313 and a contact support portion 323. A bottom of the contact support portion 323 may face the opening 110 and may extend continuously along the first direction, i.e., along the x-axis. The communication pattern 313 may define groves to a predetermined depth along the z-axis in the contact support portion 323.

The communication pattern 313 may be formed to be depressed from an upper surface 303a of the support stick 303 to a predetermined depth along the z-axis, and may have a quadrangular, e.g., rectangular, shape. Because the communication pattern 313 is formed to be depressed from the upper surface 303a of the support stick 303, it may not contact the mask 200. The communication pattern 313 may include a plurality of grooves, and the contact support portion 323 may be positioned between adjacent grooves of the communication pattern 313.

The contact support portion 323 may be adjacent to the communication patterns 313 formed to be depressed from the surface of the support stick 303, and may be in contact with the masks 200 to support the central portion of the masks 200. For example, the contact support portion 323 may be between adjacent grooves of the communication patterns 313 and may define bottoms of the grooves of the communication patterns 313, so the mask 200 may be exposed to the opening 110 through longitudinal side surfaces of the grooves, e.g., the contact support portion 323 may not be formed along longitudinal side surfaces of the groove. In this manner, in the mask assembly according to the third exemplary embodiment, because only the contact support portion 323 which is a small portion of the entire surface of the support stick 303 facing the masks 200 is in contact with the masks 200, i.e., due to the presence of the communication pattern 313, damage to the masks 200 by the support stick 303 may be restrained, e.g., as compared with a related art mask assembly.

A mask assembly according to a fourth exemplary embodiment will now be described with reference to FIGS. 9 and 10. FIG. 9 illustrates a top plan view of a support stick according to a fourth exemplary embodiment, and FIG. 10 illustrates a cross-sectional view taken along line X-X in FIG. 9.

As shown in FIGS. 9 and 10, a support stick 304 of the mask assembly according to the fourth exemplary embodiment may include grooves 340 in a contact support portion 324. A bottom of the contact support portion 324 may extend along the first direction, i.e., along the x-axis, and the grooves 304 may be formed to a predetermined depth along the z-axis in the contact support portion 324.

Contrary to the third exemplary embodiment illustrated in FIGS. 7-8, the contact support portion 324 may be formed to cover the groove 340 from the surface of the support stick 304, i.e., along longitudinal side surfaces of the grooves 340. That is, as illustrated in FIGS. 9-10, the contact support portion 324 may overlap five surfaces of each groove 304, while the contact support portion 323 may overlap three surfaces of each groove 313, e.g., and be in communication with the opening 101. The groove 340 may be depressed from the surface of the support stick 304 and may have a quadrangular, e.g., rectangular, recess shape. Because the groove 340 is formed to be depressed from the surface of the support stick 304, it may define a closed space between the masks 200 and the support stick 304. A plurality of grooves 340 may be formed, and the contact support portion 324 may be positioned between adjacent grooves 340.

The contact support portion 324 may cover the grooves 340 from the surface of the support stick 304, and may be in contact with the masks 200 to support the central portion of the masks 200 and allow the grooves 340 to form the closed space with the masks 200. In this manner, in the mask assembly according to the fourth exemplary embodiment, because only the contact support portion 324 which is a small portion of the entire surface of the support stick 304 facing the masks 200 is in contact with the masks 200, i.e., due to the presence of the grooves 340, damage to the masks 200 by the support stick 304 may be restrained, e.g., as compared with a related art mask assembly.

In the mask assembly according to exemplary embodiments, the support stick of the masks may include openings that extend from an upper surface thereof, so a contact area between the mask and the upper surface of the support stick may be minimized. Therefore, damage to the mask due to interference from the support stick may be restrained.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A mask assembly, comprising:
   a frame with an opening;
   at least one support stick in the frame and extending in a first direction to traverse the opening of the frame, the support stick including a communication pattern overlapping the opening of the frame; and
   a mask, including a plurality of pattern portions, positioned on the frame and the at least one support stick, the mask extending in a second direction perpendicular to the first direction to traverse the opening of the frame, the mask being exposed to the opening of the frame through the communication pattern, the at least one support stick including the communication pattern aligned along an axis that passes between two adjacent pattern portions of the mask and not directly underlying the at least two adjacent pattern portions of the mask along the axis.

2. The mask assembly as claimed in claim 1, wherein the support stick further comprises a contact support portion adjacent to the communication pattern, the contact support portion contacting a portion of the mask that does not include pattern portions.

3. The mask assembly as claimed in claim 2, wherein the communication pattern penetrates the support stick.

4. The mask assembly as claimed in claim 2, wherein the communication pattern extends to a predetermined depth from a surface of the support stick.

5. The mask assembly as claimed in claim 2, wherein the communication pattern includes a plurality of openings spaced apart from each other, the contact support portion being between adjacent openings.

6. The mask assembly as claimed in claim 5, wherein the communication pattern includes a plurality of circular openings.

7. The mask assembly as claimed in claim 2, wherein a surface area of the contact support portion contacting the mask is smaller than an area of the communication pattern overlapping the mask.

8. The mask assembly as claimed in claim 1, wherein the frame further comprises insertion portions, ends of the support stick being inserted into the insertion portions, and depths of the insertion portions being equal to a thickness of the support stick.

9. The mask assembly as claimed in claim 1, further comprising a plurality of masks adjacent to each other along the first direction, a longitudinal direction of each mask extending along the second direction, and a longitudinal direction of the at least one support stick extending along the first direction.

10. The mask assembly as claimed in claim 1, wherein the mask directly contacts an upper surface of the at least one support stick and the frame.

11. The mask assembly as claimed in claim 1, wherein the support stick has a predetermined width and a predetermined length, a surface area of an upper surface of the support stick contacting the mask being smaller than a product of the predetermined length and width.

12. The mask assembly as claimed in claim 1, wherein a portion of the mask overlapping the communication pattern does not directly contact an upper surface of the support stick.

13. The mask assembly as claimed in claim 1, wherein the at least one support stick does not directly underly overlap any of the pattern portions of the mask.

14. The mask assembly as claimed in claim 1, wherein a total width of the at least one support stick along the second direction is smaller than a total width of the frame along the second direction, a portion of the opening in the frame defining a space between the at least one support stick and the frame along the second direction.

15. The mask assembly as claimed in claim 5, wherein the communication pattern includes a plurality of polygonal openings.

* * * * *